Dec. 10, 1968 G. J. OVERTVELD 3,416,091

AMPLIFIER CIRCUIT HAVING FEEDBACK CONNECTION FOR REDUCING DISTORTION CAUSED BY THE NON-LINEAR CHARACTERISTIC OF ITS OUTPUT TRANSFORMER

Filed March 5, 1965

PRIOR ART

INVENTOR
G. J. OVERTVELD

AGENT

United States Patent Office
3,416,091
Patented Dec. 10, 1968

3,416,091
AMPLIFIER CIRCUIT HAVING FEEDBACK CONNECTION FOR REDUCING DISTORTION CAUSED BY THE NON-LINEAR CHARACTERISTIC OF ITS OUTPUT TRANSFORMER

Gilles Jozias Overtveld, Ottawa, Ontario, Canada, assignor to Northern Electric Company Limited, Montreal, Quebec, Canada
Filed Mar. 5, 1965, Ser. No. 437,508
10 Claims. (Cl. 330—15)

ABSTRACT OF THE DISCLOSURE

This invention relates to feedback pair amplifiers which require the use of an output transformer for connecting the amplifiers to load circuits. Because such amplifiers have very low distortion, they are much affected by the distortion caused by the output transformer which is normally used to couple such transformer to the load circuit. In accordance with the present invention, the distortion caused by the non-linear characteristic of the transformer itself is lowered by inserting the transformer in the feedback loop of the amplifier. More particularly, the primary winding of the output transformer is provided with taps and such taps are connected in the feedback loop of the amplifier to compensate for the distortion caused by the transformer.

This invention relates to the field of audio amplifiers used in telephone, broadcasting and public address systems and more particularly to an audio amplifier having low output distortion and having an improved output impedance characteristic.

Audio amplifier components behave linearly only for small signals. For large voltage and current excursions other signals than the driving input signal will be generated and appear in the output as distortion. To obtain output power with a specified distortion two avenues are open: the first one being to make the excursions small enough over a linear portion of the component characteristics; and the second one being the application of negative feedback.

The first method is uneconomical because components such as tubes, transistors, transformers are linear over a small portion of their characteristics only. The second method is well known and widely applied. It can be shown that the gain of an audio amplifier using negative feedback is:

$$\frac{e_o}{e_i}=\frac{A}{1-AB}$$

where $e_i$=input voltage of the amplifier.
$e_o$=output voltage of the amplifier.
A=gain of the amplifier without feedback.
B=amount of negative feedback.

The reason for applying negative feedback is mainly to decrease the distortion because the distorted signal is fed back into the amplifier in such a way as to tend to cancel the distortion originally generated.

A number of circuits have been designed that use the negative feedback principle. Among them are the so-called complementary symmetry and the series push-pull circuits. A more recent circuit is the so-called feedback pair a description of which may be found in the Marconi Review of the 1st Quarter 1962.

These as well as other prior art amplifier circuits require an output transformer for connecting the amplifier to the telephone circuits, broadcasting circuits or other output loads. The insertion of the transformer however effects the distortion, and the output impedance of the amplifier. Distortion is caused by the non-linearities in the B–H curve of the output transformer. The output impedance increases with frequency due to the leakage reactance of the primary and secondary windings.

Considering in particular the prior art feedback pair amplifier, the drawbacks of that circuit have been overcome in accordance with the invention by providing an amplifier including the output transformer in the feedback loop of the amplifier. More particularly applicant has discovered that by substituting the resistances of the output circuit of the so-called feedback pair mentioned previously by the primary of the output transformer, an amplifier is obtained having improved output characteristics over the prior art amplifiers with regard to distortion and output impedance.

The invention will now be described with reference to the following drawings in which.

Figure 1:
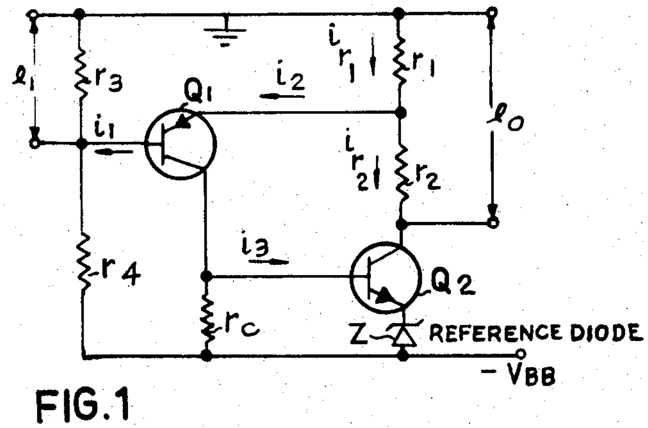
FIG. 1 illustrates the so-called feedback pair amplifier.

With reference to FIG. 1, there is shown a feedback pair comprising PNP transistor $Q_1$ and NPN transistor $Q_2$. The input voltage is applied to the base of transistor $Q_1$ and the output voltage is taken from across resistors $r_1$ and $r_2$ in the collector circuit of transistor $Q_2$.

The base of transistor $Q_1$ is connected to the junction point between resistors $r_3$ and $r_4$. The collector of transistor $Q_1$ is connected to the base of transistor $Q_2$ and to a source of D.C. potential $-V_{BB}$ through a resistor $r_c$. The emitter of transistor $Q_1$ is connected to a point between resistors $r_1$ and $r_2$.

The collector of transistor $Q_2$ is connected to ground through resistors $r_1$ and $r_2$. The emitter of transistor $Q_2$ is connected to the source of D.C. potential $-V_{BB}$ through a reference diode Z.

Assuming now that $Q_1$ and $Q_2$ are a PNP and a NPN transistor respectively having a current gain $B_1$ and $B_2$, $$i_2=B_1i_1 \quad (1)$$

$$i_3=i_2 \quad (2)$$

if $r_c >>$ input impedance of $Q_2$ then $$i_{r2}=B_1B_2i_1 \quad (3)$$

$$i_{r1}=B_1B_2i_1+B_1i_1$$

If $e_1 \cong V_{r1}$ (the effect of $Q_1$ junction neglected)

$$e_1=i_{r1}r_1=(B_1B_2i_1+B_1i_1)r_1 \quad (4)$$

Neglecting $B_1i_1$ because $B>>1$, $$e_1=B_1B_2r_1i_1 \quad (5)$$

$$Z_{in}=B_1B_2r_1 \quad (6)$$

Equation 6 shows up a very useful property of this circuit which is high input impedance.

Considering now the gain of the circuit, $$e_o=i_{r1}r_1+i_{r2}r_2$$

$$=r_1(B_1B_2i_1+B_1i_1)+(B_1B_2i_1)r_2 \quad (7)$$

$$e_o=i_1B_1B_2(r_1+r_2) \text{ neglecting } B_1i_1 \quad (8)$$

$$e_o=\frac{e_1}{r_1}(r_1+r_2)$$

substituting $i_1$ from (5)

$$\frac{e_0}{e_1}=\frac{r_1+r_2}{r_1}=\text{voltage gain}$$

The gain is defined only in terms of passive elemen and therefore very linear provided that $r_c$ is much larger than the input impedance of $Q_2$.

So far signals only have been considered. Proceeding now with the D.C. analysis of the circuit, the D.C. current in $Q_1$ is $$I_{Q_1}=\frac{V_{BB}-V_{C1}}{r_c}$$

where $V_{c1}$=collector voltage of transistor $Q_1$.

Now for a silicon transistor the base emitter voltage of transistor $Q_2$ is about 0.7 v. and so $(V_{BB}-V_{c_1})$ would be 0.7 v. in the absence of the reference diode. (For germanium the value is 0.2 v.). Consequently unless the value of $r_c$ is small a very small current will flow in $Q_1$ and this is likely to be inadequate. If $r_c$ is small then the above restriction which requires that $r_c$ be much larger than the input impedance of transistor $Q_2$ so that maximum signal current flows from $Q_1$ into the base $Q_2$ will not be met. Therefore in order to overcome this problem a D.C. voltage source $V_z$ has been introduced in the emitter lead of $Q_2$. Then $$I_{Q_1}=\frac{V_{BB}-V_{c_1}}{r_c}=\frac{V_z}{r_c}$$

and $I_{Q_1}$ may be set at any desired value. The voltage source is here shown as a reverse biased diode.

The base voltage $V_B$ of transistor $Q_1$ is determined by ratio $r3/r4$.

The above described feedback pair is very similar to the circuit described in the Marconi Review of the 1st Quarter 1962. This circuit is recognized for its low distortion, due to maximum utilization of overall negative feedback. The quality of this circuit depends very much on its linearity. However if one must use a non-linear element such as a transformer to couple it to other components of a circuit, then a great deal of its merits are lost.

Figure 2:
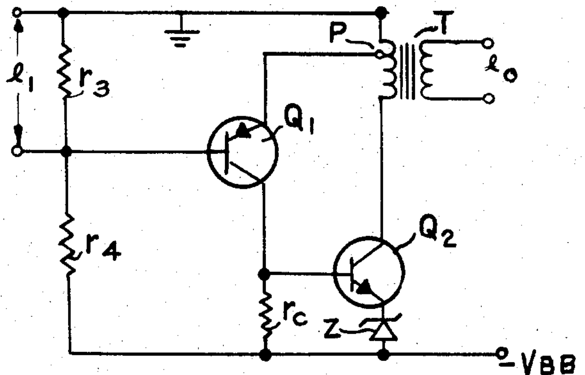
FIG. 2 illustrates the feedback pair amplifier modified in accordance with the invention.

To overcome this problem I proposed in accordance with the invention to modify the circuit such as shown in FIGURE 2 of the drawings. Resistors $r_1$ and $r_2$ are replaced by the primary of an output transformer T and a tap connection P provided to transistor $Q_1$.

A suitable transformer designed for this circuit comprised approximately 900 turns of #35 AWG wire for its primary winding. The optimum place for the tap seems to be at a position about one fourth of the total number of windings of the primary. An air gap in the transformer core is provided to obtain minimum distortion at maximum output power and bandwith.

The output characteristics of the amplifier circuit made in accordance with the invention when compared with a so-called series push pull amplifier using a separate output transformer were as follows:

PERFORMANCE

| | Disclosed circuit | Compared Circuit |
|---|---|---|
| Distortion Po=18 dbm, percent: | | |
| 20 c./s. | .22 | .165 |
| 100 c./s. | .08 | .155 |
| 1,000 c./s. | .08 | .135 |
| 5 kc./s. | .08 | .110 |
| 10 kc./s. | .08 | .150 |
| 15 kc./s. | .06 | .220 |
| 20 kc./s. | .06 | .320 |
| Output Impedance Freq.: | | |
| 20 c./s. | 122 | 155 |
| 100 c./s. | 111 | 155 |
| 1,000 c./s. | 112 | 155 |
| 5 kc./s. | 130 | 155 |
| 10 kc./s. | 155 | 225 |
| 15 kc./s. | 162 | 325 |
| 20 kc./s. | 167 | 463 |

From the above table it can be deduced that:

(a) The distortion is less than the comparison circuit, (b) The output impedance varies less with frequency than the comparison circuit.

Figure 3:
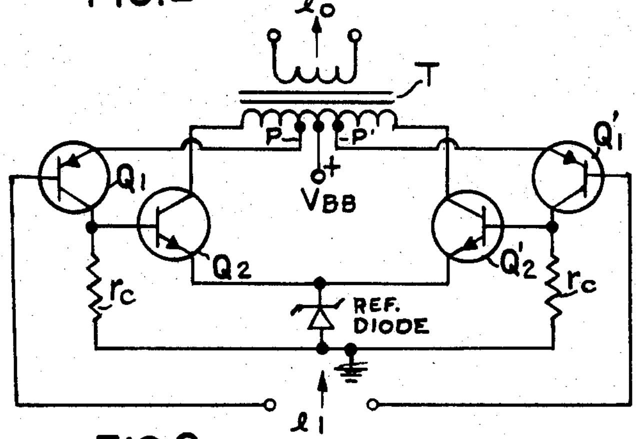
FIG. 3 is a push pull circuit embodying two feedback pairs modified in accordance with the invention.

It is to be understood that the invention also contemplates an interchange of PNP and NPN transistors in FIGURE 2 of the drawings. A push pull configuration using two feedback pair circuits such as shown in FIGURE 3 is also contemplated. Each circuit comprising transistors $Q_1$ and $Q_2$ is identical to the circuit to FIGURE 2. The input voltage is applied to the base of transistors $Q_1$ and $Q_1'$. The tap connections to the emitter electrodes of transistors $Q_1$ and $Q_1'$. A source of D.C. potential $V_{BB}$ is applied to the center tap of the primary of transformer T.

What is claimed is:

1. An amplifier circuit comprising:
(a) a first and second transistor of opposite conductivity, each transistor having base, emitter and collector electrodes;
(b) means for feeding a signal to the base electrode of said first transistor;
(c) means for connecting the collector electrode of said first transistor to the base electrode of said second transistor;
(d) an output transformer having a primary winding connected to the collector electrode of said second transistor and a secondary winding for connection to a load circuit; and
(e) means interconnecting the tap point on the primary winding to the emitter of the first transistor for feeding back a portion of the voltage developed across the primary winding of said transformer to the emitter electrode of the first transistor to decrease the distortion produced by the output transformer due to its non-linear characteristic.

2. An amplifier circuit comprising:
(a) a first and a second transistor of opposite conductivity, each transistor having base, emitter and collector electrodes;
(b) means for feeding a signal to the base of the first transistor;
(c) means for connecting the collector of the first transistor to the base electrode of the second transistor;
(d) an output transformer having a primary winding connected to the collector electrode of said second transistor and a secondary winding for connection to a load circuit; and
(e) means for providing a tap connection on said primary winding to the emitter electrode of said first transistor to feed back a portion of the voltage developed across the primary winding of the transformer to the first transistor to decrease the distortion produced by the output transformer due to its non-linear characteristic.

3. An amplifier circuit as defined in claim 2 wherein the collector circuit of the first transistor includes a resistance element having an impedance which is much higher than the input impedance of the second transistor whereby most of the signal current flows into the base of the second transistor.

4. An amplifier circuit as defined in claim 2 wherein the emitter circuit of the second transistor includes a D.C. potential source of a polarity such as to increase the D.C. current in the first transistor up to a predetermined value.

5. An amplifier circuit as defined in claim 4 wherein the D.C. potential source is a reverse biased diode.

6. An amplifier circuit as defined in claim 2 wherein the first transistor is a PNP transistor and the second transistor is a NPN transistor.

7. A push pull amplifier circuit comprising:
(a) two pairs of transistors of opposite conductivity, each transistor having base, emitter and collector electrodes;
(b) means for feeding a signal between the base electrodes of the first transistor of the pairs;
(c) means for connecting the collector electrode of the first transistor of each pair to the base electrode of the second transistor of the same pair;

(d) an output transformer having a primary winding connected between the collector electrodes of the second transistor of the pairs and a secondary winding for connection to a load circuit; and (e) means interconnecting a tap point on the primary winding and the emitter electrode of the first transistor for feeding back a portion of the voltage developed across the primary winding of said transformer to the emitter electrode of the first transistor of each pair to decrease the distortion produced by the output transformer due to its non-linear characteristic.

8. A push-pull amplifier circuit as defined in claim 7 wherein the collector circuit of the first transistor of each pair includes a resistance element having an impedance which is much higher than the input impedance of the second transistor whereby most of the signal current flows into the base of the second transistor.

9. A push-pull amplifier circuit as defined in claim 7 wherein the emitter circuit of the second transistor of each pair is common and includes a D.C. potential source of a polarity such as to increase the D.C. current in the first transistor of each pair up to a predetermined value.

10. A push-pull amplifier circuit as defined in claim 9 wherein the D.C. potential source is a reverse biased diode.

References Cited

UNITED STATES PATENTS 3,105,198 9/1963 Higgin Botham --- 330—17 XR
3,166,719 1/1965 Wiencek ------------- 330—17
3,312,833 4/1967 Durrett ----------- 330—15 X

FOREIGN PATENTS 849,316 9/1960 England.

JOHN KOMINSKI, *Primary Examiner.*

L. J. DAHL, *Assistant Examiner.*

U.S. Cl. X.R.

330—26